United States Patent
Meador et al.

(10) Patent No.: US 9,638,999 B2
(45) Date of Patent: May 2, 2017

(54) DUAL-LAYER LIGHT-SENSITIVE DEVELOPER-SOLUBLE BOTTOM ANTI-REFLECTIVE COATINGS FOR 193-NM LITHOGRAPHY

(75) Inventors: Jim D. Meador, Manchester, MO (US); Douglas J. Guerrero, Rolla, MO (US); Ramil-Marcelo L. Mercado, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 1141 days.

(21) Appl. No.: 12/389,135

(22) Filed: Feb. 19, 2009

(65) Prior Publication Data
US 2009/0226672 A1    Sep. 10, 2009

Related U.S. Application Data

(60) Provisional application No. 61/030,830, filed on Feb. 22, 2008.

(51) Int. Cl.
| | |
|---|---|
| *H01L 21/027* | (2006.01) |
| *B05D 5/06* | (2006.01) |
| *B05D 3/06* | (2006.01) |
| *B32B 3/00* | (2006.01) |
| *G03F 7/09* | (2006.01) |

(Continued)

(52) U.S. Cl.
CPC .............. *G03F 7/091* (2013.01); *G03F 7/039* (2013.01); *G03F 7/095* (2013.01); *G03F 7/2041* (2013.01); *Y10T 428/24521* (2015.01); *Y10T 428/265* (2015.01); *Y10T 428/31504* (2015.04)

(58) Field of Classification Search
USPC .... 428/161, 336, 411.1; 427/532, 553, 97.1, 427/97.6
See application file for complete search history.

(56) References Cited

U.S. PATENT DOCUMENTS

| | | | |
|---|---|---|---|
| 5,939,235 | A | 8/1999 | Kondo et al. |
| 7,358,111 | B2 | 4/2008 | Sivakumar |

(Continued)

FOREIGN PATENT DOCUMENTS

| | | |
|---|---|---|
| EP | 1 298 492 | 4/2003 |
| EP | 1 691 238 | 8/2006 |

(Continued)

OTHER PUBLICATIONS

Claypool et al., "New advanced BARC materials for ultra-high NA applications," 2005, Proceedings of SPIE, vol. 5753, 679-689.
Yamaoka et al., "Dual-mode Behaviior of Vinyl Ether Functionalized Photoresist," 1994, Journal of Photopolymer Science and Technology, vol. 7, No. 3, 533-536.

(Continued)

*Primary Examiner* — Tahseen N Khan
(74) *Attorney, Agent, or Firm* — Hovey Williams LLP (57) ABSTRACT

The present invention provides methods of fabricating microelectronics structures and the resulting structures formed thereby using a dual-layer, light-sensitive, wet-developable bottom anti-reflective coating stack to reduce reflectance from the substrate during exposure. The invention provides dye-filled and dye-attached compositions for use in the anti-reflective coatings. The anti-reflective coatings are thermally crosslinkable and photochemically decrosslinkable. The bottom anti-reflective coating stack has gradient optical properties and develops at the same time as the photoresist. The method and structure are particularly suited to high-NA lithography processes.

18 Claims, 4 Drawing Sheets

(51) Int. Cl.
*G03F 7/039* (2006.01)
*G03F 7/095* (2006.01)
*G03F 7/20* (2006.01)

(56) References Cited

U.S. PATENT DOCUMENTS

| | | |
|---|---|---|
| 2005/0255410 A1 | 11/2005 | Guerrero et al. |
| 2006/0051956 A1 | 3/2006 | Sivakumar |
| 2006/0177772 A1 | 8/2006 | Abdallah et al. |
| 2006/0177774 A1* | 8/2006 | Abdallah et al. ............. 430/311 |
| 2008/0138744 A1 | 6/2008 | Hatanaka et al. |
| 2008/0213707 A1 | 9/2008 | Brodsky et al. |

FOREIGN PATENT DOCUMENTS

| | | | |
|---|---|---|---|
| EP | 1691238 A2 * | 8/2006 | |
| WO | WO 2005093513 A2 * | 10/2005 | |
| WO | 2005/111724 | 11/2005 | |
| WO | 2006/059452 | 6/2006 | |

OTHER PUBLICATIONS

Chen et al., "Novel bilayer bottom antireflective coating structure for high performance ArF lithography applications," 2002, Journal of Microlithography, Microfabrication, and Microsystems, vol. 1, No. 1, 58-62.

Guerrero et al., "Two-layer anti-reflection strategies for implant applications," 2006, Proceedings of SPIE, vol. 6153, 61530O-1-61530O-8.

Xiang et al., "Organic ArF Bottom Anti-Reflective Coatings for Immersion Lithography," 2007, Proceedings of SPIE, vol. 6519, 651929-1-651929-10.

International Preliminary Report on Patentability dated Sep. 2, 2010, in corresponding application PCT/US09/34540 filed on Feb. 19, 2009.

International Search Report and Written Opinion dated Aug. 28, 2009, in corresponding application PCT/US09/34540 filed on Feb. 19, 2009.

Meador et al., "Dual-layer dye-filled developer-soluble BARCs for 193-nm lithography," 2008, SPIE, vol. 6923, 69232W-1-69232W-11.

* cited by examiner

DUAL-LAYER LIGHT-SENSITIVE DEVELOPER-SOLUBLE BOTTOM ANTI-REFLECTIVE COATINGS FOR 193-NM LITHOGRAPHY

RELATED APPLICATIONS

This application claims the priority benefit of a provisional application entitled DUAL-LAYER LIGHT-SENSITIVE DEVELOPER-SOLUBLE BOTTOM ANTI-REFLECTIVE COATINGS FOR 193-NM LITHOGRAPHY, Ser. No. 61/030,830, filed Feb. 22, 2008, incorporated by reference herein.

BACKGROUND OF THE INVENTION

Field of the Invention

The present invention relates in general to methods of fabricating microelectronic structures using dual-layer, light-sensitive developer-soluble bottom anti-reflective coatings, especially suited for high-NA 193-nm lithography.

Description of the Prior Art

Integrated circuit manufacturers are consistently seeking to maximize substrate wafer sizes and minimize device feature dimensions in order to improve yield and increase on-chip computing power. The demand for high density and small feature size has been constantly pushing photolithography technology to its limits. The delay of non-optical lithography technology has required the extension of existing techniques and technologies.

The minimum feature that may be patterned using an optical lithography process is determined by the following equation (Rayleigh's theory):

$$W = \frac{k_1 \lambda}{NA}$$

where W is the resolution, $k_1$ is the resolution factor (a constant), $\lambda$ is the wavelength of the exposure radiation, and NA is the numerical aperture of the exposure tool. Rayleigh's theory indicates that an exposure tool with a short wavelength and large numerical aperture will produce better pattern resolution. More recently, trends toward improving current 193 nm photolithography processes have included: 1) increasing the actual numerical aperture (NA) of the imaging lens to >0.9, thereby increasing resolution; and 2) using immersion lithography to increase the effective NA to ≥1.0, increasing resolution as well as depth of focus. Use of high-NA lithography at the 65 nm half-pitch node and immersion lithography enables $k_1$ to remain above 0.3. Using imaging tools with high-NA capabilities (>1.0) by themselves or in combination with immersion provides a method to achieve higher resolution of patterns with smaller critical dimension and higher density.

However, high-NA lithography has its own set of problems. For example, high numerical apertures cause light to diffract at high angles. In addition, use of high-NA lenses, especially in immersion lithography, results in a wide range of angles of incidence. This deviation from normal incidence causes increased reflectance at the resist-air and resist-substrate interfaces. Increased reflectance in turn causes an increase in both standing waves and CD swing. One approach to this problem has been to use a bottom anti-reflective coating applied to the substrate beneath the photoresist layer to reduce substrate reflectance. Top anti-reflective coatings, applied on top of the photoresist layer, have also been used to reduce reflectance at the top surface of the photoresist. It has been found that single layer bottom anti-reflective coatings and top anti-reflective coatings do not provide adequate reflectance control in high-NA lithography, especially when the substrate includes topography.

There is a need in the art for bottom anti-reflective coating strategies that offer increased reflection control for high-NA lithography including immersion lithography, especially over topography, that provides effective reduction in CD swing, as well as improved exposure latitudes, depth of focus, and line edge roughness. There is also a need for bottom anti-reflective coatings that are suitable for high-NA lithography, but are removable with photoresist developers.

SUMMARY OF THE INVENTION

Broadly, a method of forming a microelectronic structure is provided. The method comprises providing a substrate having a surface. A first anti-reflective coating layer is formed on the surface of the substrate, and a second anti-reflective coating layer is formed on the first anti-reflective coating layer. Advantageously, the first and second anti-reflective coating layers are both photosensitive and wet-developable.

The invention also provides a novel microelectronic structure. The microelectronic structure comprises a substrate having a surface, a first anti-reflective coating layer adjacent the substrate surface, and a second anti-reflective coating layer adjacent the first anti-reflective coating layer. Notably, the first and second anti-reflective coating layers in the structure are both photosensitive and wet-developable.

The present invention also provides a further method of forming a microelectronic structure. The method comprises providing a substrate having a surface. A first anti-reflective coating layer is formed on the surface of the substrate, and a second anti-reflective coating layer is formed on the first anti-reflective coating layer. Advantageously, the first and second anti-reflective coating layers are wet developable and have respective k values, wherein the k value of the second anti-reflective coating layer differs from the k value of the first anti-reflective coating layer by at least about 0.05.

A novel microelectronic structure is also provided. The microelectronic structure comprises a substrate having a surface, a first anti-reflective coating layer adjacent the substrate surface, and a second anti-reflective coating layer adjacent the first anti-reflective coating layer. Importantly, the first and second anti-reflective coating layers in the structure are wet developable and have respective k values, wherein the k value of the second anti-reflective coating layer differs from the k value of the first anti-reflective coating layer by at least about 0.05.

DETAILED DESCRIPTION OF THE PREFERRED EMBODIMENTS

The Inventive Method

Figure 1:
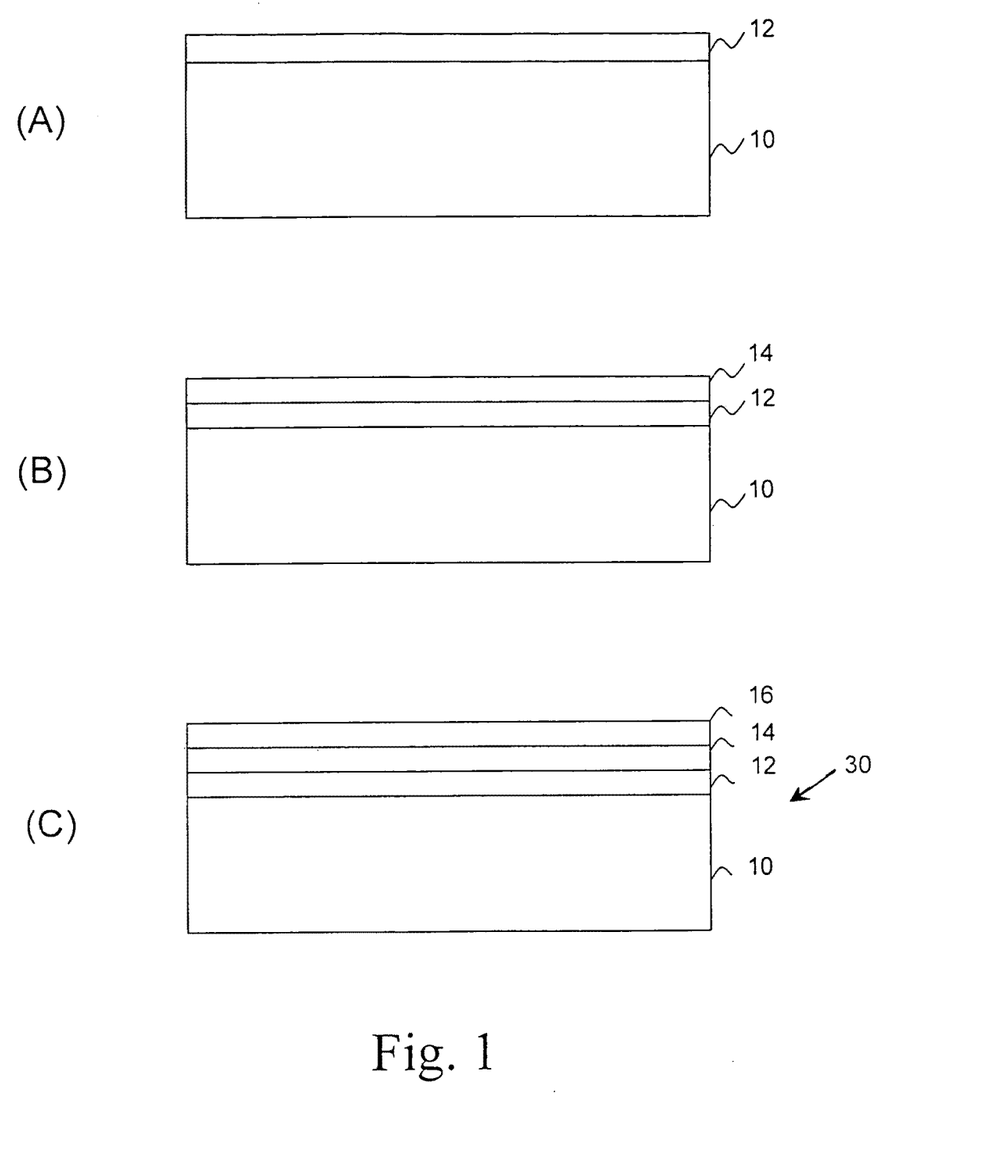
FIG. 1 illustrates one embodiment of the inventive method and structure.
Figure 2A:
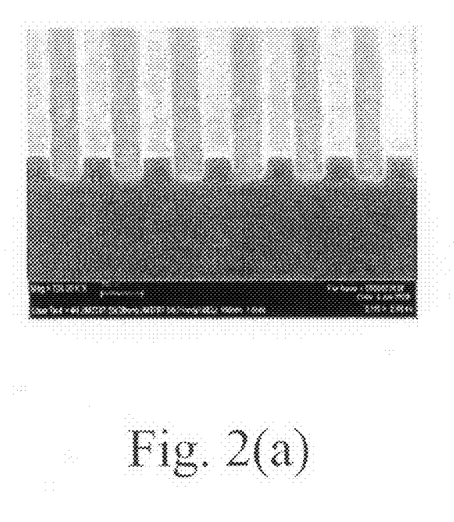
FIGS. 2(a)-2(c) are SEM photographs of the photoresist and dual-layer dye-filled bottom anti-reflective coating stack from Example 4, patterned with 150-nm lines and spaces at exposure times of 1.6 seconds, 1.7 seconds, and 1.8 seconds, respectively.
Figure 2B:
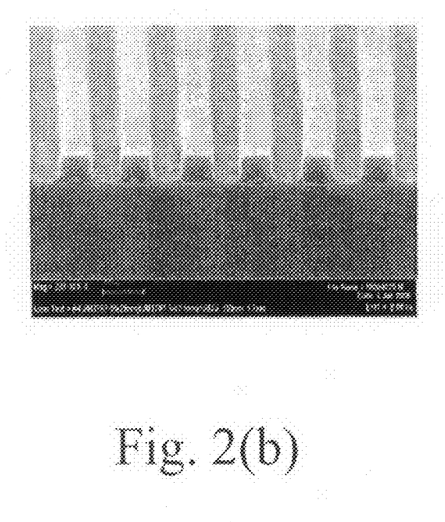
Figure 2C:
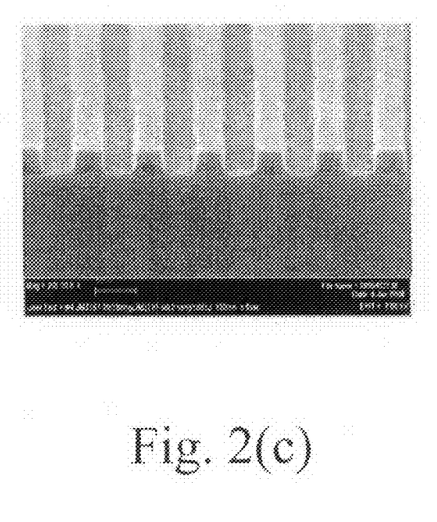

In more detail, the present invention provides a method of forming a microelectronic structure, particularly suited for high-NA lithography, including immersion lithography. In the inventive method, as shown in FIG. 1, a substrate 10 having a surface is provided. Any conventional microelectronic substrate can be utilized. Preferred substrates include those selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, and mixtures of the foregoing. The substrate 10 can have a planar surface, or it can include topography features (via holes, trenches, contact holes, raised features, lines, etc.). As used herein, "topography" refers to the height or depth of a structure in or on a substrate surface.

A light-sensitive, wet-developable anti-reflective coating composition is then applied to the substrate 10 to form a first anti-reflective coating layer 12 on the substrate 10 (FIG. 1(A)). The composition can be applied by any known application method, with one preferred method being spin-coating the composition at speeds of from about 350 rpm to about 4000 rpm (preferably from about 1000 rpm to about 2500 rpm) for a time period of from about 20 seconds to about 90 seconds (preferably from about 30 seconds to about 60 seconds). The anti-reflective coating layer 12 is then baked to induce thermal crosslinking of the composition to form a cured layer. Preferred baking conditions involve temperatures of at least about 145° C., preferably from about 150° C. to about 175° C., and more preferably from about 155° C. to about 165° C., and for a time period of from about 30 seconds to about 120 seconds (preferably from about 45 seconds to about 90 seconds).

The thickness of the first anti-reflective coating layer 12 after baking is preferably from about 10 nm to about 50 nm, more preferably from about 12 nm to about 50 nm, and most preferably from about 15 nm to about 45 nm. If the substrate 10 surface includes topography, the first anti-reflective coating 12 is preferably applied at a thickness sufficient to substantially cover the substrate topography. Preferably, the first anti-reflective coating layer 12 also has a refractive index (n value) of from about 1.4 to about 1.8, more preferably from about 1.42 to about 1.75, and even more preferably from about 1.45 to about 1.65 at the wavelength of use (e.g., 365 nm, 248 nm, 193 nm, 157 nm, or 13.5 nm, with 193 nm being the most preferred). The first anti-reflective coating layer 12 also preferably has an extinction coefficient (k value) of from about 0.2 to about 0.65, more preferably from about 0.25 to about 0.6, and even more preferably from about 0.35 to about 0.55 at the wavelength of use (e.g., 365 nm, 248 nm, 193 nm, 157 nm, or 13.5 nm, with 193 nm being the most preferred).

A second light-sensitive, wet-developable anti-reflective coating composition is then applied to the first anti-reflective coating layer 12 on the substrate 10 to form a second anti-reflective coating layer 14 (FIG. 1(B)). The second anti-reflective coating composition can be applied by any known application method, with one preferred method being spin-coating the composition at speeds of from about 350 rpm to about 4000 rpm (preferably from about 1000 rpm to about 2500 rpm) for a time period of from about 20 seconds to about 90 seconds (preferably from about 30 seconds to about 60 seconds). The second anti-reflective coating layer 14 is then baked to induce thermal crosslinking of the composition to form a second cured layer on the first anti-reflective coating layer 12. Preferred baking conditions involve temperatures of at least about 145° C., preferably from about 150° C. to about 175° C., and more preferably from about 155° C. to about 165° C., and for a time period of from about 30 seconds to about 120 seconds (preferably from about 45 seconds to about 90 seconds).

The thickness of the second anti-reflective coating layer 14 after baking is preferably from about 10 nm to about 50 nm, more preferably from about 12 nm to about 50 nm, and most preferably from about 15 nm to about 45 nm. Preferably, the second anti-reflective coating layer 14 has a refractive index (n value) of from about 1.4 to about 1.8, more preferably from about 1.42 to about 1.75, and even more preferably from about 1.45 to about 1.65 at the wavelength of use (e.g., 365 nm, 248 nm, 193 nm, 157 nm, or 13.5 nm, with 393 nm being the most preferred). The second anti-reflective coating layer 14 also preferably has an extinction coefficient (k value) of from about 0.1 to about 0.45, more preferably from about 0.15 to about 0.4, and even more preferably from about 0.17 to about 0.23 at the wavelength of use (e.g., 365 nm, 248 nm, 193 nm, 157 nm, or 13.5 nm, with 193 nm being the most preferred).

It is particularly preferred that the optical indices (n value, k value) of the second anti-reflective coating layer 14 are different from the optical indices of the first anti-reflective coating layer 12. More preferably, the k value of the second anti-reflective coating layer 14 differs from the k value of the first anti-reflective coating layer 12 by at least about 0.05, more preferably by at least about 0.10, and most preferably by at least about 0.12. The total thickness of both the first anti-reflective coating layer 12 and second anti-reflective coating layer 14 should preferably be from about 20 nm to about 100 nm, more preferably from about 30 nm to about 70 nm, and even more preferably from about 35 nm to about 55 nm. When the substrate includes topography, the total average thickness of both layers is preferably less than about 70 nm, more preferably less than about 65 nm, and even more preferably about 55 nm.

Advantageously, once crosslinked the anti-reflective layers 12, 14 will each be substantially insoluble in typical organic solvents such as ethyl lactate, propylene glycol methyl ether acetate (PGMEA), propylene glycol methyl ether (PGME), propylene glycol n-propyl ether (PnP), cyclohexanone, acetone, Gamma butyrolactone (GBL), and mixtures thereof. Thus, when subjected to a stripping test, the crosslinked layers will have a percent stripping of less than about 5%, preferably less than about 1%, and even more preferably about 0%. The stripping test involves first determining the thickness (by taking the average of measurements at five different locations) of the cured layers. This is the initial average film thickness. Next, a solvent (e.g., ethyl lactate) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

After the first and second anti-reflective coating layers 12, 14 are cured, further steps can be carried out as necessary on the resulting dual-layer anti-reflective coating stack for the particular manufacturing process. For example, as shown in FIG. 1(C) an imaging layer 16, such as a photoresist can be applied to the dual-layer anti-reflective coating stack 30. The imaging layer 16 is then post-application baked ("PAB") at a temperature of at least about 90° C., preferably from about 100° C. to about 140° C., and more preferably from about 105° C. to about 130° C., and for time periods of from about 30 seconds to about 120 seconds. The thickness of the imaging layer 16 after baking will typically be from about 120 nm to about 250 nm, and more preferably from about 130 nm to about 225 nm.

The imaging layer 16 is subsequently patterned by exposure to radiation of the appropriate wavelength (see FIG. 1(D)), followed by development of the exposed imaging layer. More specifically, the imaging layer 16 is exposed using a mask 18 positioned above the surface of the imaging layer 16. The mask 18 has open areas designed to permit radiation (hv) to pass through the mask 18 and contact surface of imaging layer 16. The remaining solid portions of the mask 18 are designed to prevent radiation from contacting the surface of imaging layer 16 in certain areas, those skilled in the art will readily understand that the arrangement of open areas and solid portions is designed based upon the desired pattern to be formed in the imaging layer 16 and ultimately in the substrate 10.

In a conventional lithography process, the medium through which the radiation passes from the radiation source to the imaging layer 16 during exposure is air. As previously noted, the present method is particularly suited to immersion lithography where NA>1.0. Preferably, in the inventive method an NA of at least about 1 is achieved, more preferably the NA is from about 1 to about 1.35, and even more preferably from about 1.2 to about 1.35.

In a preferred embodiment, the medium through which the radiation passes during exposure in the present method is preferably a liquid. More preferably, the imaging layer 16 is exposed to radiation via an optical projection element (i.e., lens) of a lithographic system, with the immersion liquid contacting at least a portion of the optical element of the lithographic system and a portion of inventive microelectronic structure (i.e., the imaging layer and dual-layer anti-reflective coating stack 30). Even more preferably, the liquid fills the space between the last optical element in the system and the imaging layer and dual-layer anti-reflective coating stack 30, such that the optical element is immersed in the liquid. Suitable immersion liquids preferably have a refractive index greater than 1 (preferably from about 1 to about 2, and more preferably from about 1.3 to about 1.4), and are selected from the group consisting of water (preferably purified water), organic solvents, and mixtures thereof. Immersion lithography systems are known in the art and include the Amphibian Interferometer from Amphibian™ Systems (Rochester, N.Y.).

Advantageously, as the imaging layer 16 is exposed to light, so are the first and second anti-reflective coating layers 12, 14, which are both light-sensitive (photosensitive) and wet-developable. That is, upon exposure to radiation, the first and second anti-reflective coating layers 12, 14 are each decrosslinked by the exposure process, thereby rendering each of the first and second anti-reflective coating layers 12, 14 developer-soluble. This eliminates the dry etch step required by prior art processes to transfer the pattern from the imaging layer to underlying layers. "Developer soluble" or "wet-developable" as used herein means the portions of the first and second anti-reflective coating layers 12, 14 that have been exposed to light can be substantially removed with conventional aqueous developers such as tetramethyl ammonium hydroxide (TMAH) developers. After light exposure, the dual-layer anti-reflective coating stack 30 with the imaging layer is preferably subjected to a post-exposure bake at a temperature of less than about 140° C., preferably from about 100° C. to about 135° C., and more preferably from about 105° C. to about 130° C., for a time period of from about 30 seconds to about 120 seconds (preferably from about 45 seconds to about 90 seconds).

The exposed portions of the first and second anti-reflective coating layers 12, 14 and imaging 16 layer, which were made developer-soluble with the above steps, are then contacted with a developer to remove the exposed portions. The exposed portions of the first and second anti-reflective coating layers 12, 14 underneath the exposed portions of the imaging layer 16 are removed by the developer as the imaging layer 16 is removed to form the desired pattern 20 in the imaging layer 16 and both of the first and second anti-reflective coating layers 12, 14. The pattern 20 can be via holes, trenches, lines, spaces, etc., that will ultimately be transferred to the substrate using an etch or ion implantation process. Preferably, at least about 95% of the exposed portions of the imaging layer 16 and anti-reflective coating layers 12, 14 will be removed by the developer, more preferably at least about 99%, and even more preferably about 100% will be removed. Suitable developers are organic or inorganic alkaline solutions such as tetramethylammonium hydroxide (TMAH), and preferably comprise an aqueous solution of TMAH at a concentration of 0.26N or lower. Preferably, the dissolution rate of each of the first and second anti-reflective coating layers in 0.26N TMAH developer will be from about 100 nm/second to about 1000 nm/second, and even more preferably from 500 nm/second to about 1000 nm/second. Conventional etching, metallization, etc., can then be carried out on the patterned stack 40 to complete the device manufacture.

An advantage of the improved reflectance control of the inventive method is better critical dimension control and accordingly, the ability to print the desired feature sizes within at least about 15% of the desired size, preferably within at least about 12% of the desired size, and even more preferably within at least about 10% of the desired size, even at very small features sizes of less than about 150 nm. For example, if the desired feature size is 100 nm lines, the feature is printed "within at least about 10%" using the inventive method so that the size of the lines ranges between 90 nm and 110 nm.

Compositions for Use in the Inventive Method

As mentioned above, the compositions used for the present process should be thermally crosslinkable and photosensitive (i.e., photochemically decrosslinkable). In more detail, the compositions preferably comprise a crosslinkable polymer dissolved or dispersed in a solvent system. The compositions also preferably comprise a dye (light attenuating moiety or compound or chromophore), a photoacid generator (PAG), and a crosslinker (referred to interchangeably with crosslinking agent) dispersed or dissolved in the solvent system with the polymer.

Preferred polymers will comprise an acid functional group. The acid group is preferably present in the polymer at a level of at least about 7% by weight, preferably from about 10% to about 22% by weight, and even more preferably from about 11% to about 17% by weight, based upon the total weight of the polymer taken as 100% by weight. Preferred acid groups are selected from the group consisting of phenolics, carboxylic acids (—COOH), and mixtures thereof. Unlike prior art compositions, the acid group does not have to be protected by a protective group, and in an alternative embodiment is preferably free of protective groups. More particularly, at least about 95%, preferably at least about 98%, and preferably about 100% of the acid groups are free of protective groups in this embodiment. A protective group is a group that prevents the acid from being reactive.

Because protective groups are not necessary with the present invention, the polymer does not have to be acid-sensitive, and is optionally, not acid-sensitive. An acid-sensitive polymer is one that contains protective groups that are removed, decomposed, or otherwise converted in the presence of an acid.

The weight average molecular weight (Mw) of the polymer is preferably from about 8,000 to about 75,000 Daltons, and more preferably from about 12,000 to about 50,000 Daltons. Preferred polymers include those selected from the group consisting of acrylates, methacrylates, acrylic acids, styrenes, vinyls, and mixtures thereof. The polymer is preferably present in the composition at a level of from about 0.6% to about 5% by weight, preferably from about 0.9% to about 4.5% by weight, and even more preferably from about 1.2% to about 4% by weight, based upon the total weight of all ingredients in the composition taken as 100% by weight.

The dye can be physically mixed into the composition (referred to as a "dye-filled" composition), or it can be bonded with the polymer (either to a functional group on the polymer, or preferably, attached directly to the polymer backbone) (referred to as a "dye-attached" composition). The inventive microelectronic structures can be formed using two dye-filled bottom anti-reflective coating compositions or two dye-attached bottom anti-reflective coating compositions, one for each anti-reflective coating layer in the dual-layer stack. Alternatively, one of each type of composition may be used in the dual-layer stack. That is, one of the bottom anti-reflective coating layers can be formed from the dye-filled anti-reflective coating composition, and the other bottom anti-reflective coating layer can be formed from the dye-attached anti-reflective coating composition.

When the dye is physically mixed into the composition with the polymer to form the dye-filled composition, the dye is preferably a polymeric dye with acid functionality. Suitable polymeric dyes for use in the dye-filled anti-reflective coatings are selected from the group consisting of poly(hydroxystyrenes) such as branched poly(4-hydroxystyrene), poly(vinylbenzoic acids), and mixtures thereof. The dye moiety of the polymeric dye should be present in the composition at a level of from about 50% to about 92% by weight, preferably from about 65% to about 90% by weight, and more preferably from about 75% to about 85% by weight, based upon the total weight of the polymeric dye taken as 100% by weight. In this embodiment, is also preferred that the main polymer itself comprises pendant carboxylic acid functionality. More preferably, the main polymer used in the dye-filled anti-reflective coating compositions is transparent. Particularly preferred polymers for use in the dye-filled compositions of the invention are selected from the group consisting of acrylates, methacrylates, acrylic acids, styrenes, vinyls, and combinations thereof. The weight ratio of polymeric dye to main polymer in this embodiment is preferably from about 0.05:1 to about 0.7:1, and more preferably from about 0.5:1. During thermal crosslinking of the dye-filled composition, the crosslinker reacts with both the acidic function on the polymeric dye and the carboxylic acid on the polymer resulting in a crosslinked (i.e., cured) layer. Exposure and post-exposure bake regenerates the acidic function on both the dye and the polymer, with the formation of by-products. The chemistry of this process is depicted in the reaction scheme below.

In an alternative embodiment, the dye is attached directly to the polymer, and preferably to the polymer backbone. Suitable dyes for use in the dye-attached composition are preferably selected from the group consisting of styrene monomers, vinylbenzoic acids, and combinations thereof. The dye should be present in the composition at a level of from about 10% to about 50% by weight, preferably from about 15% to about 45% by weight, and more preferably from about 18% to about 35% by weight, based upon the total weight of the polymer taken as 100% by weight. The polymer in this embodiment preferably has pendant acidic functionality (—OH, —COOH, etc.). Particularly preferred polymers for use in the dye-attached compositions of the invention are selected from the group consisting of acrylates, methacrylates, acrylic acids, styrenes, vinyls, and combinations thereof. The weight ratio of dye to polymer in this embodiment is preferably from about 0.2:1 to about 0.33:1, and more preferably from about 0.5:1. During thermal crosslinking of the dye-attached composition, the crosslinker reacts with the acidic function on the polymer resulting in a crosslinked (i.e., cured layer). Unlike the dye-filled composition, the dye preferably does not participate in crosslinking in the dye-attached composition. Exposure and post-exposure bake regenerates the acidic function on the polymer, with the formation of by-products from the crosslinker. The chemistry of this process is depicted in the reaction scheme below, although the dye is not shown.

Reaction Scheme B

Preferred PAGs for use in either the dye-filled or dye-attached anti-reflective compositions are selected from the group consisting of: onium salts (e.g., triphenyl sulfonium perfluorosulfonates such as TPS nonaflate, TPS triflate, and substituted forms thereof, such as tris(4-tert-butylphenyl) sulfonium perfluoro-1-butanesulfonate (an alkyl-substituted TPS nonaflate), all available from Sigma-Aldrich); oxime-sulfonates (e.g., those sold under the name CGI® by CIBA); triazines (e.g., TAZ108® available from Midori Kagaku Company); and combinations thereof. The PAG should be present in the compositions at a level of from about 0.01% to about 0.1% by weight, preferably from about 0.015% to about 0.08% by weight, and more preferably from about 0.02% to about 0.06% by weight, based upon the total weight of the composition taken as 100% by weight.

Preferred crosslinkers for use in either the dye-filled or dye-attached bottom anti-reflective coating compositions are selected from the group consisting of vinyl ether crosslinkers, epoxies, and mixtures thereof. An example of commercially-available vinyl ethers include those sold under the trade name VECTomer™ (Aldrich; St. Louis, Mo.). An example of suitable epoxies include those available under the name Araldite® (e.g., MY720 tetra functional epoxy resin) from Huntsman Advanced Materials. It is particularly preferred that the crosslinkers be multi-functional (di-, tri-, and tetra-functional). The crosslinker is preferably present in the composition at a level of from about 0.1% to about 1.2% by weight, preferably from about 0.15% to about 1% by weight, and even more preferably from about 0.2% to about 0.7% by weight, based upon the total weight of the composition taken as 100% by weight.

More preferably, the vinyl ether crosslinkers for use in the compositions have the formula $$R'-(X-O-CH=CH_2)_n,$$

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of Preferred solvent systems include a solvent selected from the group consisting of PGMEA, PGME, PnP, ethyl lactate, and mixtures thereof. Preferably, the solvent system has a boiling point of from about 118-160° C., and more preferably from about 118-146° C. The solvent system should be utilized at a level of from about 97% to about 99.1% by weight, preferably from about 98% to about 98.9% by weight, and even more preferably from about 98.1% to about 98.8% by weight, based upon the total weight of the composition taken as 100% by weight. The anti-reflective coating compositions will preferably comprise a solids content of from about 0.9% to about 3% by weight solids, preferably from about 1.1% to about 2% by weight solids, and even more preferably from about 1.2% to about 1.9% by weight solids, based upon the total weight of the composition taken as 100% by weight.

Any additional ingredients are also preferably dispersed in the solvent system along with the polymer. For example, the compositions also preferably comprise reaction stoppers, including photodecomposable bases and quenchers. Examples of suitable photodecomposable bases include sulfonium hydroxides (e.g., triphenylsulfonium hydroxide), iodonium hydroxides (e.g., diphenyliodonium hydroxide) and the conjugated salts thereof, such as tri phenyl sulfonium acetate, triphenylsulfonium camphonate, and triphenylsulfonium camphorate. When present, the anti-reflective coating compositions will preferably comprise from about 0.0015% to about 0.1% by weight photodecomposable base, preferably from about 0.002% to about 0.08% by weight, and even more preferably from about 0.003% to about 0.07% by weight, based upon the total weight of the composition taken as 100% by weight. Preferred quenchers are selected from the group consisting of triethanolamine, triethylamine, trimethanolamine, trimethylamine, triisopropanol amine, triisopropylamine, tri-t-butanolamine, tri-t-butylamine, tri-n-butanolamine, tri-n-butylamine, diethanolamine, diethylamide, dimethanolamine, dimethylamine, diisopropanolamine, diisopropylamine, di-t-butanolamine, di-t-butylamine, di-n-butanolamine, di-n-butylamine, ethanolamine, ethylamine, methanolamine, methylamine, isopropanolamine, isopropylamine, t-butanolamine, t-butylamine, n-butanolamine, and n-butylamine, and combinations thereof. When present, the anti-reflective coating compositions will preferably comprise from about 0.002% to about 0.05% by weight quencher, preferably from about 0.003% to about 0.04% by weight, and even more preferably from about 0.004% to about 0.02% by weight, based upon the total weight of the composition taken as 100% by weight.

Additional ingredients that may be optionally included in the composition include surfactants, adhesion promoters, antioxidants, photoinitiators, and combinations of the foregoing.

Other suitable wet-developable compositions for use in the inventive method are disclosed in published U.S. Patent Application Pub. No. 2005/0255410, incorporated by reference herein.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of "Transparent" Terpolymer with Pendant Carboxylic Acid Function for Dye-Filled, Bottom Anti-Reflective Coatings In this procedure, a 500-ml, three-necked flask was charged with 18.40 grams (213.7 mmol) of methacrylic acid, 25.06 grams (149.0 mmol) of cyclohexyl methacrylate, 19.1 grams (134 mmol) t-butyl methacrylate, and 156.41 grams of PGME. The flask was equipped with a magnetic stirring bar, dropping funnel with nitrogen inlet, condenser with nitrogen outlet, and thermometer. Next, the dropping funnel was charged with a solution containing 6.88 grams (25.4 mmol) of dicumyl peroxide, and 67.14 grams of PGME. The system was flushed with nitrogen for about 15 minutes, and the flask was then immersed in an oil bath at 122° C. With the reaction solution temperature at 119° C. and stirring under nitrogen, the dicumyl peroxide solution was slowly added to the flask over 2.8 minutes. The resulting solution was stirred under nitrogen at about 118° C.-123° C. for 24 hours.

The solution was then cooled in the air to about ambient conditions. Next, 73 mg of 4-methoxyphenol were added to the cooled solution, followed by stirring to homogeneity. The yield of product was 289.6 grams, with theory being 292.3 grams (99.1% recovery). Percent polymer solids (theory) was 23.49%. The weight-average molecular weight (Mw) of the resulting polymer was 36,700 Daltons, as determined by gel permeation chromatography (GPC). The % by weight of free monomer for the reagents, was a follows:
methacrylic acid: 0%
cyclohexyl methacrylate: 0.22%
t-butyl methacrylate: 0.02%

Example 2

Formulation of Dye-Filled Light-Sensitive Bottom Anti-Reflective Coating Optimized Using Design of Experiment (DOE) Software and Having a k-Value of 0.5

In this Example, a bottom anti-reflective coating having a k value of 0.5 was prepared using the polymer from Example 1. A 250-ml amber Nalgene® bottle was charged with 1.541-1.542 grams of branched poly(4-hydroxystyrene), 133.084 grams of PGME, and 33.842-33.843 grams of PGMEA. The mixture was tumbled at ambient conditions for 2.0 hours. Next, 0.502 grams (quantitatively added) of an in-house prepared vinyl ether crosslinker (preparation described in Example 13) and 3.094 grams of the polymer solution from Example 1 were added to the bottle. The resulting mixture was tumbled at ambient conditions for 15.6 hours. To this mixture were added, 0.1470 grams of tris(4-tert-butylphenyl)sulfonium perfluoro-1-butanesulfonate (Sigma-Aldrich; St. Louis, Mo.), followed by tumbling at ambient conditions for 3.2 hours. Next, 0.0205 grams of aqueous triphenylsulfonium hydroxide (TPS-OH; 21.9 wt. % solids; from Charkit Chemical; Norwalk, Conn.) were quantitatively added to the bottle. The resulting mixture was tumbled at ambient conditions for 45 hours. The resulting bottom anti-reflective coating was then twice filtered through a 0.1-μm endpoint filter into 60-ml amber Nalgene® bottles.

The film properties of the anti-reflective coating formulation were then tested. The bottom anti-reflective coating formulation was spin coated onto a silicon substrate, at 1,500 rpm for 60 seconds, followed by baking at 160° C. for 60 seconds. The initial thickness of the resulting film was measured and recorded using a Gaertner ellipsometer. The solvent resistance of the layer was then tested. A solvent (ethyl lactate) was puddled onto the film for 20 seconds, followed by spin drying at about 3,000 rpm for about 30 seconds to remove the solvent. The thickness was measured again using the ellipsometer, and the % stripping or swelling was calculated.

Next, the solubility of the layer in photoresist developer before and after exposure was tested. First, the unexposed layer was baked at 130° C. for 90 seconds. A photoresist developer (0.26 N TMAH) was then puddled onto the film for 60 seconds, followed by a 5-second deionized water rinse while spinning at 300 rpm, and then spin drying at about 3,000 rpm for about 30 seconds to remove the developer. The thickness of the layer was measured using the ellipsometer and the % development was calculated. Next, the layer was exposed at 20 mJ/cm$^2$ with broadband light on an Oriel™ DUV broadband exposure unit. The exposed layer was subjected to a post-exposure bake (PEB) at 130° C. for 90 seconds. A photoresist developer (0.26 N TMAH) was then puddled onto the film for 60 seconds, followed by a 5-second deionized water rinse while spinning at 300 rpm, and then spin drying at about 3,000 rpm for about 30 seconds to remove the developer. The thickness of the layer was measured again, and the % development was calculated. The n and k values of the film were measured using a J.A. Woollam Co., Inc. VASE®. The film properties are listed in Table I.

TABLE I

Film properties of anti-reflective coating where k = 0.5

| Film Thickness (nm) | EL Stripping or Swell | Unexposed film Development | Exposed film Development | n value at 193 nm | k value at 193 nm |
|---|---|---|---|---|---|
| 54.6 | −0.92% | −7.25% | −100% | 1.47 | 0.49 |

Example 3

Formulation of DOE-Optimized Dye-Filled, Light-Sensitive, Bottom Anti-Reflective Coatings Having a k-Value of 0.2

In this Example, a bottom anti-reflective coating having a k value of 0.2 was prepared using the polymer from Example 1. A 250-ml, amber Nalgene® bottle was charged with 0.467 grams of branched poly(4-hydroxystyrene), 130.3616 grams of PGME, and 33.853 grams of PGMEA. The mixture was tumbled at ambient conditions for 16.9 hours. Next, 0.759 grams of an in-house prepared vinyl ether crosslinker and 6.578 grams of the polymer solution from Example 1 were added to the bottle. The mixture was tumbled at ambient conditions for 1.4 hours. To this mixture, 0.085 grams of tris(4-tert-butylphenyl)sulfonium perfluoro-1-butanesulfonate were added, and the resulting mixture was tumbled at ambient conditions for 1.0 hour. Next, 0.0206-0.021 grams of aqueous TPS-OH (21.9 wt. % solids) were quantitatively added, and the mixture was tumbled at ambient conditions for 4.1 hours. The resulting bottom anti-reflective coating was twice filtered through a 0.1-μm endpoint filter into 60-ml amber Nalgene® bottles.

The film properties of the anti-reflective coating formulation were then tested. The bottom anti-reflective coating formulation was spin coated onto a silicon substrate at 1,500 rpm for 60 seconds, followed by baking at 160° C. for 60 seconds. The initial thickness of the resulting film was measured and recorded. The solvent resistance of the layer was then tested. A solvent (ethyl lactate) was puddled onto the film for 20 seconds, followed by spin drying at about 3,000 rpm for about 30 seconds to remove the solvent. The thickness was measured again and the % stripping or swelling was calculated.

Next, the solubility of the layer in photoresist developer before and after exposure was tested. First, the unexposed layer was baked at 130° C. for 90 seconds. A photoresist developer (0.26 N TMAH) was then puddled onto the film for 60 seconds, followed by a 5-second deionized water rinse while spinning at 300 rpm, and then spin drying at about 3,000 rpm for about 30 seconds to remove the developer. The thickness of the layer was measured and the % development was calculated. Next, the layer was exposed at 40 mJ/cm$^2$ with broadband light on an Oriel exposure unit. The exposed layer was subjected to a PEB at 130° C. for 90 seconds. A photoresist developer (0.26 N TMAH) was then puddled onto the film for 60 seconds, followed by a 5-second deionized water rinse while spinning at 300 rpm, and then spin drying at about 3,000 rpm for about 30 seconds to remove the developer. The thickness of the layer was measured again, and the % development was calculated. The n and k values of the film were measured on a J.A. Woollam Co., Inc. VASE®. The film properties are listed in Table II.

TABLE II

Film properties of anti-reflective coating where k = 0.2

| Film Thickness (nm) | EL Stripping or Swell | Unexposed film Development | Exposed film Development | n value at 193 nm | k value at 193 nm |
|---|---|---|---|---|---|
| 54.8 | −0.64% | −1.05% | −100% | 1.55 | 0.20 |

Example 4

193-nm Lithography with Dual-Layer Bottom Anti-Reflective Coatings and Photoresist In this Example, the anti-reflective coating formulations prepared in Examples 2 (k value=0.5) and 3 (k value=0.2) were used to form a dual-layer bottom anti-reflective coating stack for 193 nm lithography. First, the 0.5 k-value bottom anti-reflective coating was spin-coated onto a silicon wafer at 1,350 rpm for 60 seconds, followed by baking at 160° C. for 60 seconds. The layer had a thickness of 28 nm. Next, the 0.2 k value bottom anti-reflective coating was spin-coated onto the 0.5 k value anti-reflective coating layer at 2,000 rpm for 60 seconds, followed by baking at 160° C. for 60 seconds. The second layer had a thickness of 20 nm. Next, a layer of a photoresist composition (AR1682J; from JSR Micro, Inc.) was spin-coated onto the dual-layer bottom anti-reflective coating at 3,200 rpm for 30 seconds. The photoresist was then subjected to a post-application bake (PAB) at 110° C. for 60 seconds. The photoresist layer had a thickness of 130 nm.

Figure 3A:
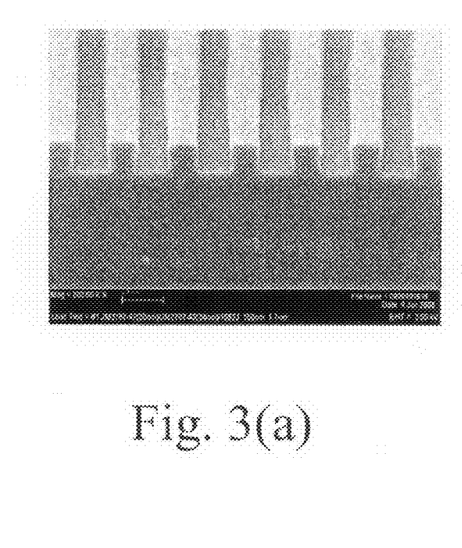
FIGS. 3(a)-3(c) are SEM photographs of the photoresist and dual-layer dye-attached bottom anti-reflective coating stack from Example 12, patterned with 150-nm lines and spaces at exposure times of 1.7 seconds, 1.8 seconds, and 1.9 seconds, respectively.
Figure 3B:
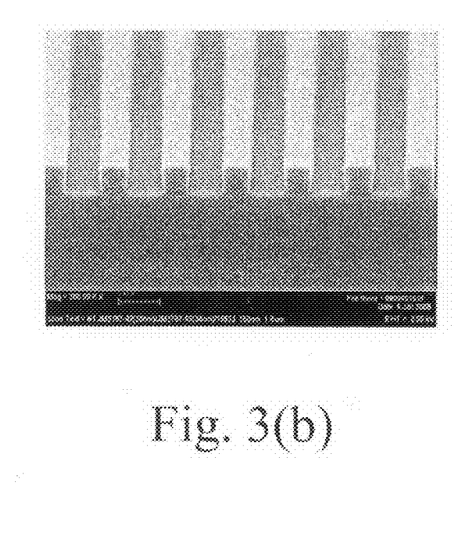
Figure 3C:
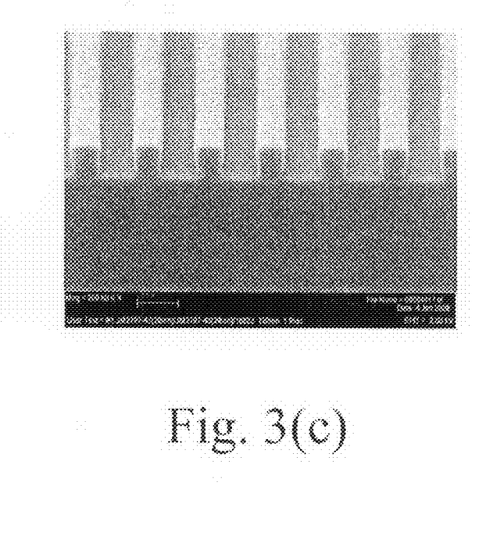

The resulting stack was then exposed using an Amphibian interferometer from Amphibian™ Systems (Rochester, N.Y.), followed by PEB at 110° C. for 60 seconds. The wafer stack was then developed by immersing in 0.26 N TMAH developer for 45 seconds, followed by a deionized water rinse and spin drying. SEM photographs were then taken of cross-sectioned wafers on a LEO 1560 from Carl Zeiss SMT Inc. FIG. 3 shows SEM photographs of the photoresist and dual-layer anti-reflective coatings patterned with 150 nm lines and spaces (1:1), at exposure times of 1.6 seconds (FIG. 3(a)), 1.7 seconds (FIG. 3(b)), and 1.8 seconds (FIG. 3(c)).

Example 5

Synthesis of a Dye-Attached Polymer for 0.4 k Value Bottom Anti-Reflective Coating In this Example, a 500-ml three-necked flask equipped with a magnetic stirring bar and thermometer was charged with 6.93 grams (80.5 mmol) of methacrylic acid, 5.85 grams (56.2 mmol) of styrene, 171.19 grams of PGME, and 12.59 grams (50.7 mmol) of 2-ethyl-2-adamantyl methacrylate (AD-EM). The mixture was stirred at ambient conditions to produce a reaction solution. A condenser with nitrogen outlet and dropping funnel with nitrogen inlet were then attached to the flask. Next, the dropping funnel was charged with a solution prepared from 498 mg (3.03 mmol) of 2,2'-azobisisobutyronitrile (AIBN) and 56.11 grams of PGME. The system was gently flushed with nitrogen for 15 minutes, and the flask was then immersed in an oil bath at 100° C. With the reaction solution temperature at 103.5° C. and stirring under nitrogen, the AIBN solution was slowly added to the flask over 1.2 minutes. The resulting mixture was stirred under nitrogen for 24 hours at 99° C.-105° C.

The mixture was then cooled in the air to about ambient conditions. Next, 0.06 grams of 4-methoxyphenol were added to the cooled mixture, and the mixture was stirred to homogeneity. The yield of polymer solution was 251.1 grams (99.2% recovery). Theoretical percent polymer solids was 10.2%. The weight average molecular weight (Mw) was 11,000 Daltons, as measured using GPC.

Percentage of monomers that did not enter polymer:
methacrylic acid: 30.73%
styrene: 9.22%
AD-EM: 9.55%

Example 6

Precipitation of the Polymer from Example 5 for Dye-Attached, 0.4 k Value Bottom Anti-Reflective Coatings In this procedure, a 4-liter beaker equipped with an overhead stirrer and dropping funnel was charged with 1,500 ml of hexanes. Next, 149.8 grams of the polymer solution from Example 5 were added to the dropping funnel. With the hexanes stirring under ambient conditions, the polymer solution from Example 5 was added dropwise to the beaker over 21 minutes. The resulting mixture was then stirred for an additional 13 minutes at ambient conditions. Next, the solvent was separated from the polymer by a vacuum filtration. About 200 ml of fresh hexanes were then added to the polymer precipitate, and the mixture was stirred for 5.5 minutes. The solvent was again removed by a vacuum filtration. The polymer was allowed to dry at ambient conditions for about 3 days and then ground to a white powder in a mortar and pestle. The polymer was then further dried at 50° C. in a vacuum for 24 hours. The total yield was 8.77 grams (57.5% yield from the polymer mother liquor).

Example 7

Formulation of Precursor for Dye-Attached Bottom Anti-Reflective Coating

A 250-ml, amber Nalgene® bottle was charged with 1.8654 grams of the polymer from Example 6, 120.4998 grams of PGME, 30.1249 grams of PGMEA, 0.5413 grams of an in-house vinyl ether crosslinker, 0.0262 grams TPS nonaflate (a triphenylsulfonium salt PAG from Sigma-Aldrich), 0.0278 grams of tris(4-tert-butylphenyl)sulfonium perfluoro-1-butanesulfonate, and 0.1376 grams of triethanolamine (10 wt. % in PGME). The mixture was tumbled for 2 hours at ambient conditions to homogeneity. The product was then filtered twice through a 0.1-µm endpoint filter into three, 60 ml, amber Nalgene® bottles.

Example 8

Formulation of Dye-Attached Bottom Anti-Reflective Coating

In this procedure, 15.003 grams of the precursor prepared in Example 7 were added to an amber Nalgene® bottle, along with 9.902 grams of 80.0/20.0 PGME/PGMEA. The mixture was tumbled at room temperature for 32 minutes. The resulting solution was then twice filtered through a 0.1-µm endpoint filter into a 60-ml, amber Nalgene® bottle.

The bottom anti-reflective coating formulation was spin coated onto a silicon wafer, followed by baking at 160° C. for 60 seconds. The film had a n value of 1.63 and a k value of 0.39 at 193 nm, as measured on a J.A. Woollam Co., Inc. VASE®.

Example 9

Synthesis of Dye-Attached Polymer for Bottom Anti-Reflective Coating Having a k Value of 0.2 and Preparation of Mother Liquor To synthesize a dye-attached polymer, a 500-ml three-necked flask was charged with 6.91 grams (80.3 mmol) of methacrylic acid, 11.03 grams (77.57 mmol) of t-butyl methacrylate, 2.00 grams (19.2 mmol) of styrene, and 134.71 grams of PGME. The flask was equipped with a magnetic stirring bar, a thermometer, a condenser with nitrogen outlet, and a dropping funnel with nitrogen inlet. A separate solution was prepared from 0.4714 grams (2.87 mmol) of AIBN and 44.67 grams of PGME. This solution was added to the dropping funnel. The reaction system flask was flushed with nitrogen for more than 10 minutes, and the flask was then immersed in an oil bath at 104° C. With the reaction solution temperature at 107.5° C. and stirring under nitrogen, the AIBN solution was slowly added to the flask solution over 2.2 minutes. The resulting solution was then stirred under nitrogen at 98.5° C.-108.5° C. for 24 hours. Next, 49.8 mg of 4-methoxyphenol were added to the polymer solution, which was then stirred at room temperature to homogeneity. The yield was 197.7 grams (98.9% recovery). Theoretical percent polymer solids was 10.2%. The weight average molecular weight (Mw) was 15,234 Daltons, as determined by GPC.

Example 10

Precipitation of Polymer from Example 9 Mother Liquor

In this procedure, a 4-liter beaker equipped with an overhead stirrer and dropping funnel was charged with 1,500 ml of hexanes. Next, 137.9 grams of the polymer mother liquor from Example 9 were added to the dropping funnel. With the hexanes stirring under ambient conditions, the polymer solution was added dropwise over 20 minutes. The resulting mixture was then stirred at ambient conditions for an additional 10 minutes. Next, the solvent was removed from the polymer precipitate by a vacuum filtration. About 150 ml of fresh hexanes were then added to the polymer, and the mixture was stirred at room temperature for 5 minutes. The solvent was again removed by a vacuum filtration. The polymer was stirred with an additional 85 ml of hexanes for 5 minutes, followed by removing the solvent by a vacuum filtration. Next, the polymer in the beaker was dried in a 50° C. vacuum oven for 51 minutes and then ground to a powder in a mortar and pestle. The powder was then dried further in the 50° C. vacuum oven for 24 hours. The percent yield from the mother liquor was 75%.

Example 11

Formulation of Dye-Attached Bottom Anti-Reflective Coating

In this Example, a dye-attached bottom anti-reflective coating was prepared. First, a precursor was made by charging a 250-ml, amber Nalgene® bottle with the following ingredients in the order listed: 0.5349 grams of an in-house vinyl ether crosslinker, 147.472 grams of ethyl lactate, 1.814 grams of powdered polymer precipitate from Example 10, 0.0279 grams of tris(4-tert-butylphenyl)sulfonium perfluoro-1-butanesulfonate, and 0.026 grams of TPS nonaflate PAG. The mixture was tumbled at room temperature for 16 hours.

Next, 0.139 grams of triethanolamine (10 wt. % in PGME) were added (quantitatively transferred) to the bottle. Upon the addition of the triethanolamine solution, a precipitate formed in the mixture. The mixture was tumbled at room temperature for about 4 days, which produced a precursor solution. The precursor solution was then twice filtered through a 0.1-µm endpoint filter into three, 60-ml, amber Nalgene® bottles.

The bottom anti-reflective coating composition was then prepared by mixing 22.504 grams of the precursor solution and 7.512 grams of ethyl lactate in an amber Nalgene® bottle. The solution was tumbled at room temperature for 77 minutes. The solution was then twice filtered through a 0.1-µm endpoint filter into a 60-ml, amber Nalgene® bottle.

The resulting bottom anti-reflective coating formulation was spin coated onto a silicon wafer, at 1400 rpm for 60 seconds, followed by baking at 160° C. for 60 seconds. The film had an n value of 1.60 and a k value of 0.19 at 193 nm measured using a J.A. Woollam Co., Inc. VASE®.

Example 12

193-nm Lithography Using Dye-Attached Bottom Anti-Reflective Coating and Photoresist In this Example, the dye-attached anti-reflective coating formulations prepared in Examples 8 (k value=0.39) and 11 (k value=0.19) were used to form a dual-layer bottom anti-reflective coating stack for 193-nm lithography. First, the 0.39 k-value bottom anti-reflective coating was spin-coated onto a silicon wafer at 3750 rpm for 60 seconds, followed by baking at 160° C. for 60 seconds. The layer had a thickness of 22 nm. Next, the 0.19 k value bottom anti-reflective coating was spin-coated onto the 0.39 k value anti-reflective coating layer at 1290 rpm for 60 seconds, followed by baking at 160° C. for 60 seconds. The second layer had a thickness of 31 nm. Then, a photoresist (AR1682J) was spin-coated onto the dual-layer bottom anti-reflective coating stack at 3,200 rpm for 30 seconds, followed by PAB at 110° C. for 60 seconds. The photoresist layer had a thickness of 130 nm.

The resulting stack was then exposed using an Amphibian interferometer from Amphibian™ Systems (Rochester, N.Y.), followed by PEB at 110° C. for 60 seconds. The wafer stack was then developed by immersing in 0.26 N TMAH developer for 45 seconds. FIG. 4 shows SEM photographs of the photoresist and dual-layer anti-reflective coatings patterned with 150 nm lines and spaces (1:1), at exposure times of 1.7 seconds (FIG. 4(a)), 1.8 seconds (FIG. 4(b)), and 1.9 seconds (FIG. 4(c)).

Next, the same photoresist and dual-layer bottom anti-reflective coating stack was patterned with 90 nm lines and spaces (1:1), but the pattern did not clear before lift-off.

Example 13

Vinyl Ether Crosslinker Formulation

In this Example, the in-house vinyl ether crosslinker used in Examples 2, 3, 7, and 11 was prepared by adding 25.15 grams of tetramethylene glycol monovinyl ether (Aldrich, St Louis, Mo.), 22.91 grams of triethylamine (Aldrich, St Louis, Mo.), and 250 ml tetrahydrofuran ("THF"; Aldrich, St. Louis, Mo.) to a 500-ml, 2-neck flask. The flask was equipped with a stir bar, addition funnel, condenser, and nitrogen inlet and outlet. The flask was immersed in an ice water bath and the solution was stirred under a flow of nitrogen.

Next, 20.00 grams of 1,3,5-benzenetricarbonyl trichloride (Aldrich, St. Louis, Mo.) were dissolved in 50 ml THF in a 250-ml Erlenmeyer flask. This solution was transferred to the addition funnel on the 500-ml 2-neck flask and added dropwise to the stirring tetramethylene glycol monovinyl ether/triethylamine/THF solution for about 15 minutes, until the addition was completed. A white precipitate formed on contact. The flask was then removed from the ice bath and the slurry was allowed to come to room temperature in the flask, which took approximately 16 hours. The slurry was then heated to reflux for 4 hours. The flask was removed from the heat and allowed to cool to room temperature. The slurry was then filtered using a suction filtration setup, and concentrated using a rotary evaporator to give a viscous yellow liquid.

This liquid was dissolved in 100 ml of diethylether (Aldrich, St. Louis, Mo.) and washed twice with 25-ml portions of aqueous, 12.5% tetramethylammonium hydroxide (TMAH; Aldrich, St. Louis, Mo.). The ether layer was extracted using a separatory funnel and then washed twice using 50-ml portions of deionized water. The ether layer was allowed to settle out and collected. The ether layer was dried by mixing with 5.0 g of activated basic alumina. The mixture was stirred for 1 hour and gravity filtered. The clear yellow liquid was concentrated in a rotavap to give a yellow viscous oil. Total yield was approximately 29.28 grams (77% yield).

Example 14

Additional Crosslinker Formulation

In this Example, the preparation of another crosslinker is described. The crosslinker can be prepared by adding 24.70 grams of 2-(vinyloxy)ethanol, 27.44 grams of triethylamine, and 300 ml THF to a 500-ml, 2-neck flask. The solution can be immersed in an ice water bath and stirred under a flow of nitrogen.

Next, 24.01 grams of 1,3,5-benzenetricarbonyl trichloride can be dissolved in 100 ml THF in a 250-ml Erlenmeyer flask. This solution will then be added dropwise to the 2-(vinyloxy)ethanol/triethylamine/THF solution until the addition is complete. The slurry can then be brought to room temperature and then heated to reflux for about 4 hours. The slurry can be cooled to room temperature and then filtered using a suction filtration setup. The solution will then be concentrated using a rotary evaporator to give a viscous yellow liquid.

Next, the liquid will be dissolved in 100 ml of ether and washed twice with 50-ml portions of aqueous TMAH. The ether layer can then be extracted and washed twice using 50-ml portions of deionized water. The ether layer will then be dried over anhydrous magnesium sulfate. Finally, the solvent can be removed under pressure.

We claim:

1. A method of forming a microelectronic structure comprising:
   (a) providing a substrate having a surface;
   (b) forming a crosslinked first anti-reflective coating layer on said surface, wherein said first anti-reflective coating layer has a k value at a wavelength of exposing radiation of 193 nm of from about 0.2 to 0.65; and
   (c) forming a crosslinked second anti-reflective coating layer on said first anti-reflective coating layer, wherein said second anti-reflective coating layer has a k value at a wavelength of exposing radiation of 193 nm of from about 0.1 to about 0.45, said first and second anti-reflective coating layers being photosensitive and wet-developable in a photoresist developer, and said second anti-reflective coating layer k value being different from said first anti-reflective coating layer k value by at least about 0.05.

2. The method of claim 1, wherein said crosslinked first anti-reflective coating layer is substantially insoluble in photoresist solvents.

3. The method of claim 2, wherein said crosslinked second anti-reflective coating layer is substantially insoluble in organic solvents.

4. The method of claim 1, said method further comprising applying a photoresist to said second anti-reflective coating layer to form an imaging layer on said second anti-reflective coating layer.

5. The method of claim 1, wherein:
   wherein said substrate surface comprises a plurality of topography features; and
   said forming (b) comprises applying said first anti-reflective coating layer to substantially cover said topography features of said substrate.

6. The method of claim 1, said method further comprising:
   (d) exposing said first and second anti-reflective coating layers to radiation to yield exposed portions of said first and second anti-reflective coating layers.

7. The method of claim 6, said method further comprising:
   (e) contacting said first and second anti-reflective coating layers with a developer so as to remove said exposed portions from said surface.

8. The method of claim 6, said first anti-reflective coating layer in (b) and said second anti-reflective coating in (c) having respective initial solubilities in a base developer, wherein after said exposing (d), said exposed portions of said first anti-reflective coating layer and said second anti-reflective coating layer have respective final solubilities in base developer, said final solubilities being greater than said initial solubilities.

9. The method of claim 6, wherein said exposing (d) comprises exposing said first and second anti-reflective coating layers to radiation from an optical projection element wherein an immersion liquid is in contact with at least a portion of said element and at least a portion of said anti-reflective coating layers.

10. The method of claim 1, wherein said first anti-reflective coating layer is formed from a composition comprising a polymer dispersed or dissolved in a solvent system, said polymer comprising an acid group.

11. The method of claim 10, said composition further comprising a dye physically mixed into said composition with said polymer.

12. The method of claim 10, wherein said polymer comprises a dye bonded to said polymer.

13. The method of claim 10, said first anti-reflective coating composition further comprising an ingredient selected from the group consisting of crosslinking agents, photoacid generators, and mixtures thereof dispersed or dissolved in the solvent system with the polymer.

14. A microelectronic structure comprising:
   a substrate having a surface;
   a crosslinked first anti-reflective coating layer adjacent said substrate surface; and
   a crosslinked second anti-reflective coating layer adjacent said first anti-reflective coating layer, wherein said first and second anti-reflective coating layers are photosensitive and wet-developable in a photoresist developer;
   wherein: said first anti-reflective coating layer has a k value at a wavelength of exposing radiation of 193 nm of from about 0.2 to 0.65; said second anti-reflective coating layer has a k value at a wavelength of exposing radiation of 193 nm of from about 0.1 to about 0.45; and said second anti-reflective coating layer k value is different from said first anti-reflective coating layer k value by at least about 0.05.

15. The structure of claim 14, wherein said first anti-reflective coating layer has a thickness of from about 10 nm to about 50 nm.

16. The structure of claim 14, wherein said second anti-reflective coating layer has a thickness of from about 10 nm to about 50 nm.

17. The structure of claim 14, wherein said substrate includes a plurality of topography features, said first anti-reflective coating layer substantially covering said features.

18. The structure of claim 14, further comprising an imaging layer adjacent said second anti-reflective coating layer.

* * * * *